(12) United States Patent
Yoshida et al.

(10) Patent No.: US 9,817,312 B2
(45) Date of Patent: Nov. 14, 2017

(54) SILICON-CONTAINING HEAT- OR PHOTO-CURABLE COMPOSITION

(71) Applicant: AZ ELECTRONIC MATERIALS (LUXEMBOURG) S.A.R.L., Luxembourg (LU)

(72) Inventors: Naofumi Yoshida, Kakegawa (JP); Yuji Tashiro, Kakegawa (JP)

(73) Assignee: AZ Electronic Materials (Luxembourg) S.à r.l., Luxembourg (LU)

( * ) Notice: Subject to any disclaimer, the term of this patent is extended or adjusted under 35 U.S.C. 154(b) by 0 days.

(21) Appl. No.: 15/031,668

(22) PCT Filed: Oct. 14, 2014

(86) PCT No.: PCT/JP2014/077299
§ 371 (c)(1),
(2) Date: Apr. 22, 2016

(87) PCT Pub. No.: WO2015/060155
PCT Pub. Date: Apr. 30, 2015

(65) Prior Publication Data
US 2016/0266490 A1  Sep. 15, 2016

(30) Foreign Application Priority Data

Oct. 21, 2013 (JP) ................. 2013-218485
Sep. 18, 2014 (JP) ................. 2014-189852

(51) Int. Cl.
| | | |
|---|---|---|
| G03F 7/075 | (2006.01) | |
| G03F 7/40 | (2006.01) | |
| G03F 7/38 | (2006.01) | |
| G03F 7/30 | (2006.01) | |
| G03F 7/16 | (2006.01) | |
| G03F 7/20 | (2006.01) | |
| G03F 7/32 | (2006.01) | |
| C09D 183/14 | (2006.01) | |
| C08L 83/14 | (2006.01) | |
| C08G 77/52 | (2006.01) | |

(52) U.S. Cl.
CPC ............ *G03F 7/0757* (2013.01); *C08L 83/14* (2013.01); *C09D 183/14* (2013.01); *G03F 7/162* (2013.01); *G03F 7/20* (2013.01); *G03F 7/30* (2013.01); *G03F 7/322* (2013.01); *G03F 7/38* (2013.01); *G03F 7/40* (2013.01); *C08G 77/52* (2013.01)

(58) Field of Classification Search
None
See application file for complete search history.

(56) References Cited

U.S. PATENT DOCUMENTS

| | | |
|---|---|---|
| 3,325,530 A | 6/1967 | Wu et al. |
| 3,464,937 A | 9/1969 | Bamford et al. |
| 2007/0026667 A1 | 2/2007 | Tashiro et al. |
| 2007/0026689 A1 | 2/2007 | Nakata et al. |

(Continued)

FOREIGN PATENT DOCUMENTS

| | | |
|---|---|---|
| JP | 2002-76203 A | 3/2002 |
| JP | 2007-12639 A | 1/2007 |

(Continued)

OTHER PUBLICATIONS

Machine-assisted English translation of JP2010-282031, provided by JPO (2010).*

(Continued)

*Primary Examiner* — Sin Lee
(74) *Attorney, Agent, or Firm* — Mitchell Brustein (57) ABSTRACT

A heat- or photo-curable composition comprising: a polysiloxane which is produced by reacting a silicon compound (i) represented by the formula: $R^1{}_n Si(X)_{4-n}$ (wherein $R^1$ represents an alkyl group, an aryl group or the like; X represents a chlorine atom or an alkoxy group; and n represents 0 to 2) with a silicon compound (ii) represented by the formula (b) or (c) (wherein $R^2$ to $R^7$ independently represent an alkyl group or the like; $M^1$ and $M^2$ independently represent an arylene group, an alkylene group or the like; and $Y^1$ to $Y^6$ independently represent a chlorine atom or an alkoxy group) in the presence of an alkali catalyst or an acid catalyst; a polymerization initiator which enables the generation of an acid or a base by the action of heat or light; and a solvent. The composition enables the formation of a thick film. When the composition is coated onto a substrate, is then heated or exposed to light, is then developed if necessary, and is then heated and cured at a low temperature, a cured film can be formed.

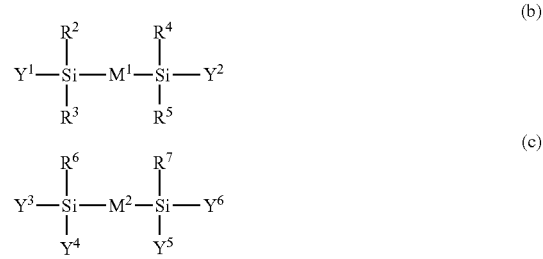

20 Claims, 1 Drawing Sheet

(56) References Cited

U.S. PATENT DOCUMENTS

2008/0241748 A1 10/2008 Motallebi et al.
2012/0238095 A1 9/2012 Ogihara et al.

FOREIGN PATENT DOCUMENTS

| JP | 2007-16177 A | 1/2007 |
| JP | 2010-282031 A | 12/2010 |
| JP | 2012-194216 A | 10/2012 |
| WO | 2013/080884 A1 | 1/2013 |

OTHER PUBLICATIONS

Jun-chao Huang et al., "Polyimide/POSS nanocomposites: interfacial interaction, thermal properties and mechanical properties", Polymer vol. 44, pp. 4491-pp. 4499 (2003).
United States Statutory Invention Registration No. H1612 Published Nov. 5, 1996, Rhein et al.

* cited by examiner

SILICON-CONTAINING HEAT- OR PHOTO-CURABLE COMPOSITION

This application is a United States National Stage Patent Application under 35 U.S.C. §371 of International Patent Application No. PCT/JP2014/077299, filed Oct. 14, 2014 which claims priority to Japanese Patent Applications No. 2013-218485, filed Oct. 21, 2013 and No. 2014-189852, filed Sep. 18, 2014, the contents of which are being hereby incorporated herein by reference.

FIELD OF THE INVENTION

The present invention relates to a silicon-containing heat- or photo-curable composition, and more specifically, to a silicon-containing heat- or photo-curable composition which can be suitably used as a sealing film, an insulation film, and the like in Wafer-level Chip Size Package (WL-CSP), 3D packaging etc. and can form a thick film. Furthermore, the present invention also relates to a method for forming a cured film by using the silicon-containing heat- or photo-curable composition, a cured film formed by the silicon-containing heat- or photo-curable composition, and an element comprising the cured film.

BACKGROUND ART

In recent years, developments towards Wafer-level Chip Size Package (WL-CSP) or 3D packaging have been progressed to achieve a high-density integration, miniaturization, thinning, and weight reduction of package in the field of IC packaging. In this field, an epoxy resin, polyimide, polybenzoxazole and a benzocyclobutene (BCB) resin which are the existing sealing polymers have been used as a sealing polymer. It is, however, required to lower the curing temperature and form a thick film as well as to achieve a high insulation, an excellent heat resistance, a good chemical resistance etc. in Wafer-level Chip Size Package, 3D packaging, and the like. Furthermore, a matter to be achieved in Wafer-level Chip Size Package (WL-CSP) or 3D packaging is a matching between the thermal expansion coefficient of an underlayer material and the thermal expansion coefficient of a material coated on the underlayer. When the difference between these thermal expansion coefficients becomes large, a problem of curvature occurs.

The consistency of the thermal expansion coefficient significantly influences the reliability of package and it also affects the device life. The curvature of the sealed wafer causes problems in each manufacturing process of the wafer sealed with a sealing material, such as a conveyance process, a polishing process, a test process, and a dicing process, at manufacturing of a package. It is, therefore, hoped that the sealing film material and the insulation film material, which are used in Wafer-level Chip Size Package and 3D packaging, have a thermal expansion coefficient of ppm ($40 \times 10^{-6}$/° C.) or less, specifically. As polyimide and polybenzoxazole are organic polymers, the thermal expansion coefficients thereof are essentially large. For solving this problem, it was proposed to prevent the curvature of the package by lowering the modulus of elasticity of the sealing film in Wafer-level Chip Size Package (see the patent document 1 below). In this proposal, sealing films were formed by curing a modified polyalkylene oxide compound which has an alkoxysilyl group at its terminal together with an epoxy resin or the like. However, the average thermal expansion coefficient thereof is about $100 \times 10^{-6}$/° C.

In addition, the introduction of a silicon element into the polymer lowers the thermal expansion coefficient as the intermolecular force of a Si—O bond is essentially larger than that of a C—C bond. Therefore, the introduction of a silicon element to a polyimide skeleton was studied (see the non-patent document 1 below). However, no photosensitive material having a low thermal expansion coefficient such as $40 \times 10^{-6}$/° C. or less as mentioned above, being able to form a thick film, and being excellent in properties such as a heat resistance and a chemical resistance has been found so far.

CITATION LIST

Patent Document

Patent document 1: JP 2002-76203 A

Non-Patent Document

Non-patent document 1: Polymer 44 (2003) 4491-4499 polyimide/POSS nanocomposite: interfacial interaction, thermal properties and mechanical properties

SUMMARY OF THE INVENTION

Problems to be Solved by the Invention

The present invention was made under the aforementioned circumstances and an object of the present invention is to provide a silicon-containing heat- or photo-curable composition which can form a thick film and a cured film or pattern excellent in a low thermal expansion, an insulation, a heat resistance, and an chemical resistance at a temperature of 250° C. or less, which is particularly useful for 3D packaging.

Another object of the present invention is to provide a method for forming a cured film by using the silicon-containing heat- or photo-curable composition described above, a cured film formed by the silicon-containing heat- or photo-curable composition described above, and an element comprising the cured film.

Means for Solving the Problem

As a result of intensive studies and investigations, the present inventors found that a cured film or pattern excellent in a large film thickness formation, a low thermal expansion, an insulation, a heat resistance, and a chemical resistance could be formed by introducing a bond such as aryldisilane as a plastic group into a polymer, all skeletons of which are siloxane. The present invention was accomplished based on the findings.

The present invention relates to a heat- or photo-curable composition, a method for preparing a cured film by using the heat- or photo-curable composition, the cured film, and an element comprising the cured film, which are shown in the following (1) to (9).

(1) A heat- or photo-curable composition comprising;

(I) polysiloxane obtained by reacting at least one of silicon compounds (i) represented by the formula (a):

$$R^1{}_n Si(X)_{4-n} \qquad (a)$$

wherein, $R^1$ represents a hydrogen atom, a liner or branched alkyl group having 1 to 20 carbon atoms in which any —CH$_2$— group may be replaced by a —O—, —C=C— or —CO— group and any hydrogen atom may be replaced by a fluorine atom, and which may have a substituent, an aryl group having 6 to 20 carbon atoms in which any hydrogen atom may be replaced by a fluorine atom and which may have a substituent, a cycloalkyl group having 3 to 20 carbon atoms in which any hydrogen atom may be replaced by a fluorine atom and which may have a substituent, or an alkenyl group having 2 to 20 carbon atoms in which any hydrogen atom may be replaced by a fluorine atom and which may have a substituent, X represents a chlorine atom or an alkoxy group having 1 to 6 carbon atoms, and n is 0 to 2; and at least one of silicon compounds (ii) represented by the formula (b):

(b)

wherein, $R^2$ to $R^5$ may be the same or different from each other and represent an alkyl group which may be substituted, an aryl group which may be substituted, or an alkenyl group which may be substituted, $M^1$ represents an arylene group which may be substituted, a biphenylene group which may be substituted, an alkylene group having 1 to 4 carbon atoms which may be substituted, or an alkynylene group having 2 to 4 carbon atoms which may be substituted, $Y^1$ and $Y^2$ may be the same or different from each other and represent a chlorine atom or an alkoxy group having 1 to 6 carbon atoms, or represented by the formula (c):

(c)

wherein, $R^6$ and $R^7$ may be the same or different from each other and represent an alkyl group which may be substituted, an aryl group which may be substituted, or an alkenyl group which may be substituted, $M^2$ represents an arylene group which may be substituted, a biphenylene group which may be substituted, an alkylene group having 1 to 4 carbon atoms which may be substituted, or an alkynylene group having 2 to 4 carbon atoms which may be substituted, and $Y^3$ to $Y^6$ may be the same or different from each other and represent a chlorine atom or an alkoxy group having 1 to 6 carbon atoms; under an alkali catalyst or an acid catalyst, (II) a polymerization initiator which enables the generation of an acid or an base by the action of heat or light, and (III) a solvent.

(2) The heat- or photo-curable composition described in (1) above, wherein a dissolution rate of a film after prebaking of the polysiloxane (I) in a 2.38 weight % tetramethylammonium hydroxide aqueous solution is 50 to 20,000 Å/second.

(3) The heat- or photo-curable composition described in (1) or (2) above, wherein a ratio of the silicon compounds (ii) to the whole silicon compounds in the polysilicon (I) is 0.1 to 40 mol %.

(4) The heat- or photo-curable composition described in any one of (1) to (3) above, wherein the polymerization initiator (II) is contained by 0.001 to 10 weight parts to polysiloxane (I) by 100 weight parts.

(5) The heat- or photo-curable composition described in any one of (1) to (4) above, wherein at least one kind of additives selected from a group consisting of a developer dissolution accelerator, a scum remover, an adhesion enhancer, a polymerization inhibitor, a defoaming agent, a surfactant, and a photosensitizer is further contained.

(6) A method for preparing a cured film which comprises the steps of: applying the heat- or photo-curable composition described in any one of (1) to (5) above to a substrate to form a coating film; heating or light-exposing the coating film to generate an acid or a base; and curing the heated or light-exposed coating film by thermal process.

(7) The method for preparing a cured film described in (6) above, wherein a photo-curable composition is used as the heat- or photo-curable composition and a step of developing the light-exposed coating film is further provided after the light-exposing step of the photo-curable composition.

(8) A cured film which is formed from the heat- or photo-curable composition described in any one of (1) to (5) above.

(9) An element which comprises the cured film described in (8) above.

Advantageous Effect of the Invention

The silicon-containing heat- or photo-curable composition of the present invention enables the formation of a thick film and the cured film formed using the composition satisfies the coefficient of thermal expansion required to a sealing film material and an insulation film material used in WL-CSP, 3D packaging and the like. In addition to this, various properties such as a heat resistance, a chemical resistance, and an insulation property thereof are superior. Therefore, it can be particularly suitably used as a sealing film, an insulation film etc. in WL-CSP, 3D packaging and the like. Furthermore, it can be also suitably utilized as a planarization film for a substrate of a thin film transistor (TFT) used at a back plane of displays such as a liquid crystal display element and an organic EL display element and an interlayer insulating film of a semiconductor element. Further, it can also preferably utilized as a planarization film, an insulation film, and a barrier film provided on a surface of a substrate such as a glass, a metal foil, or plastics, a buffer coat film of an IC chip, and a hard coat layer. The elements comprising the cured film have excellent properties and are superior in durability.

MODE FOR CARRYING OUT THE INVENTION

The present invention will be explained below in detail.
Silicon-Containing Heat- or Photo-Curable Composition The silicon-containing heat- or photo-curable composition of the present invention is characterized by containing at least polysiloxane (I), a polymerization initiator (II), and a solvent (III). In addition, a silicon-containing photocurable composition in the aforementioned composition is a negative-working photosensitive composition. Hereinafter, each component used in the silicon-containing heat- or photo-curable composition of the present invention will be explained in detail.

(I) Polysiloxane

The silicon-containing heat- or photo-curable composition of the present invention contains polysiloxane (I) as a main component. The polysiloxane indicates a polymer containing a Si—O—Si bond generally but in the present invention, polysiloxane including an organic polysiloxane substituted by an organic substituent other than an unsubstituted inorganic polysiloxane is called "polysiloxane". Such polysiloxane is one having a silanol group or an alkoxysilyl group generally. This silanol group or alkoxysilyl group means a hydroxyl group or alkoxy group directly bound to a silicon atom forming a siloxane skeleton. The silanol group and the alkoxysilyl group are considered to have an effect promoting a curing reaction when forming a cured film by using a composition and contribute to a reaction with silicon-containing compounds described below. It is, therefore, preferable that the polysiloxane has these groups.

The polysiloxane used in the present invention is not particularly limited to the skeleton structure and any skeleton structure may be selected according to a purpose. The skeleton structure can be classified into following three categories according to a number of oxygen atom; i.e. a silicone skeleton (a number of oxygen atom binding to a silicon atom is 2), a silsesquioxane skeleton (a number of oxygen atom binding to a silicon atom is 3), and a silica skeleton (a number of oxygen atom binding to a silicon atom is 4). The polysiloxane used in the present invention is not particularly limited to a skeleton structure and can be selected from any one of these skeleton structures according to a purpose. The molecule of polysiloxane may include a combination of a plurality of these skeleton structures.

More specifically, the disilane-containing polysiloxane of the present invention is obtained by reacting at least one of the silicon compound (i) represented by the aforementioned formula (a) with at least one of the silicon compound (ii) represented by the aforementioned formula (b) or (c) in the existence of an alkali catalyst or an acid catalyst.

Examples of the silicon compound represented by the formula (a) include following 3 compounds, specifically.

$R^1{}_2Si(X)_2$          (d)

$R^1Si(X)_3$          (e)

$Si(X)_4$          (f)

In the formulae, $R^1$ and X represent groups defined above.

In the silicon compound represented by the formula (a) or the formula (d) or (e), the substituent of a liner or branched alkyl group having 1 to 20 carbon atoms, in which any —CH$_2$— group may be replaced by a —O—, —C═C— or —CO— group and any hydrogen atom may be replaced by a fluorine atom, and which may have a substituent, of $R^1$ can be selected from any substituent as long as it does not impair the effect of the present invention. Specifically, preferable examples of the substituent include a phenyl group, a phenylcarbonyloxy group, a phenylacetoxy group, a phenyldiethylcarboxy group, and the like, which may have a substituent such as a hydroxyl group or an amino group, for example, p-hydroxyphenyl group etc. Examples of the liner or branched alkyl group having 1 to 20 carbon atoms, in which any —CH$_2$— group may be replaced by a —O—, —C═C— or —CO— group and any hydrogen atom may be replaced by a fluorine atom, and which may have a substituent, of $R^1$ include a methyl group, an ethyl group, a propyl group, an isopropyl group, a t-butyl group, a n-hexyl group, a n-decyl group, a trifluoropropyl group, a 2,2,2-trifluoroethyl group, a 3,3,3-trifluoropropyl group, an allyloxyundecyl group, a vinyloxybutyl group, a styrylethyl group, an acetoxypropyl group, an acetoxymethyl group, a 2-(acryloxyethyl) group, a 2-(2-ethoxyethoxy)ethane-1-ol group, a 1-(p-hydroxyphenyl)ethyl group, a 2-(p-hydroxyphenyl)ethyl group, a 4-hydroxy-5-(p-hydroxyphenylcarbonyloxy)pentyl group, and a benzoyloxypropyl group. Silicon compounds in which $R^1$ is a methyl group are particularly preferred as the raw materials are easily available and the cured film thereof has a high hardness and a high chemical resistance.

Furthermore, as examples of the aryl group in the aryl group having 6 to 20 carbon atoms, which may have a substituent, of $R^1$, a phenyl group, a naphthyl group, and the like are given. The substituent thereof can be selected from any groups as long as the group does not impair the effect of the present invention and specific examples of the substituent include an alkyl group, a hydroxyl group, and an amino group. As examples of the aryl group having 6 to 20 carbon atoms, in which any hydrogen atom may be replaced by a fluorine atom and which may have a substituent, of $R^1$, for example, a phenyl group, a tolyl group, and p-hydroxyphenyl group are preferably given. As examples of the cycloalkyl group having 3 to 20 carbon atoms, in which any hydrogen atom may be replaced by a fluorine atom and which may have a substituent, a cyclohexyl group and the like are given. Further, as examples of the alkenyl group having 2 to 20 carbon atoms, in which any hydrogen atom may be replaced by a fluorine atom and which may have a substituent, a vinyl group and the like are given. Of these, the phenyl group is a preferable group as the solubility of the formed polymer in a solvent can be raised and the cured film obtained is hardly cracked. In addition, two $R^1$s in the formula (d) may be the same or different from each other.

As examples of the alkoxy group having 1 to 6 carbon atoms of a group X in the formulae (a), and (d) to (f), a methoxy group, an ethoxy group, an n-propoxy group, an isopropoxy group, and an n-butoxy group are preferably given, for example. X in the formula may be the same or different from each other.

Specific examples of the silicon compound represented by the formula (d) include dichlorosilane, dimethoxysilane, diethoxysilane, di-n-propoxysilane, diisopropoxysilane, di-n-butoxysilane, dimethyldichlorosilane, dimethyldimethoxysilane, dimethyldiethoxysilane, dimethyldi-n-propoxysilane, dimethyldiisopropoxysilane, dimethyldi-n-butoxysilane, diethyldichlorosilane, diethyldimethoxysilane, diethyldiethoxysilane, diethyldi-n-propoxysilane, diethyldi-n-butoxysilane, di-n-propyldichlorosilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldichlorosilane, di-n-butyldichlorosilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-hexyldichlorosilane, di-n-hexyldimethoxysilane, di-n-hexyldiethoxysilane, di-decyldichlorosilane, didecyldimethoxysilane, ditrifluoromethyldiethoxysilane, ditrifluoromethyldichlorosilane, di-3,3,3-trifluoropropyldimethoxysilane, di-3,3,3-trifluoropropyldichlorosilane, divinyldimethoxysilane, divinyldichlorosilane, diphenyldimethoxysilane, diphenyldiethoxysilane, diphenyldichlorosilane, ditrifluoromethyldimethoxysilane, dinaphthyldimethoxysilane, dinaphthyldiethoxysilane, and dinaphthyldichlorosilane. Dimethyldichlorosilane, dimethyldimethoxysilane, dimethyldiethoxysilane, diethyldimethoxysilane, diethyldiethoxysilane, diphenyldimethoxysilane, and diphenyldiethoxysilane are preferable compounds as these compounds are easily available.

Specific examples of the silicon compound represented by the formula (e) include trichlorosilane, trimethoxysilane, triethoxysilane, tri-n-propoxysilane, triisopropoxysilane, tri-n-butoxysilane, methyltrichlorosilane, methyltrimethoxysilane, methyltriethoxysilane, methyltriisopropoxysilane, methyltri-n-butoxysilane, ethyltrichlorosilane, ethyltrimethoxysilane, ethyltriethoxysilane, ethyltriisopropoxysilane, ethyltri-n-butoxysilane, n-propyltrichlorosilane, n-propyltrimethoxysilane, n-propyltriethoxysilane, n-butyltrimethoxysilane, n-butyltriethoxysilane, n-hexyltrichlorosilane, n-hexyltrimethoxysilane, n-hexyltriethoxysilane, decyltrichlorosilane, decyltrimethoxysilane, trifluoromethyltrimethoxysilane, trifluoromethyltriethoxysilane, 3,3,3-trifluoropropyltrichlorosilane, 3,3,3-trifluoropropyltrimethoxysilane, phenyltrichlorosilane, phenyltrimethoxysilane, phenyltriethoxysilane, naphthyltrichlorosilane, naphthyltrimethoxysilane, naphthyltriethoxysilane, vinyltrichlorosilane, and vinyltrimethoxysilane. Of these, methyltrimethoxysilane, methyltriethoxysilane, phenyltrimethoxysilane and phenyltriethoxysilane are preferable compounds as these compounds are easily available and coating films formed using these compounds have excellent properties.

Specific examples of the silicon compound represented by the formula (f) include tetrachlorosilane, tetramethoxysilane, tetraethoxysilane, tetrapropoxysilane, and tetrabutoxysilane. Of these, tetrachlorosilane, tetraethoxysilane and tetramethoxy silane are preferable compounds as these compounds have a high reactivity.

The use ratio of these silicon compounds represented by the formula (d): $R^1_2Si(X)_2$, the formula (e): $R^1Si(X)_3$, and the formula (f): $Si(X)_4$ depends on what kind of compound being used as the compounds corresponding to these formulae. However, the mol ratio of (d):(e):(f) is preferably 0-30:40-80:0-30 in general. When the silicon compound represented by the formula (f) is not used, a cured film having a wide crack threshold may be prepared. Each silicon compound represented by the formulae (d), (e), and (f) may be used alone or in a combination of two or more thereof.

On the other hand, the silicon compound (ii) is a compound represented by the formula (b) or (c). In the formula (b) or (c), the disilyl group is a Si-$M^1$-Si bond or a Si-$M^2$-Si bond, and $M^1$ and $M^2$ represent an arylene group which may be substituted, a biphenylene group which may be substituted, an alkylene group having 1 to 4 carbon atoms, which may be substituted, an alkynylene group having 2 to 4 carbon atoms, which may be substituted. These groups are linear, rigid groups. Therefore, these groups serve to improve a crack threshold of polymer. Of these, a phenylene group which may be substituted is preferable as it can be easily available and the structure is rigid. Examples of the substituent include a fluorine atom, an alkyl group having 1 to 3 carbon atoms, and so on. As the silicon compound (ii), silicon compounds selected from silicon compounds represented by the formula (b) and silicon compounds represented by the formula (c) may be used alone or in a combination of two or more thereof. The amount of the silicon compound (ii) is preferably 0.1 to 40 mol %, more preferably 10 to 40 mol % to a total amount of the silicon compound (i) and the silicon compound (ii), i.e. to whole silicon compounds.

In the silicon compound represented by the formula (b) or (c), the substituent of an alkyl group which may be substituted, an aryl group which may be substituted or an alkenyl group which may be substituted, of $R^2$ to $R^7$ can be selected from any group as long as the group does not impair the effect of the present invention. For example, a fluorine atom, a hydroxyl group, an amino group, an alkyl group which may have a substituent such as a hydroxyl group or an amino group, and an aryl group which may have a substituent such as a hydroxyl group or an amino group are specifically given as the substituent.

Specific examples of the substituent of an alkyl group which may be substituted, an aryl group which may be substituted or an alkenyl group which may be substituted, of $R^2$ to $R^7$ include the same groups as the groups exemplified in $R^1$ of the formula (a), and a methyl group, an ethyl group, a propyl group, an isopropyl group, a t-butyl group, a n-hexyl group, a n-decyl group, a trifluoropropyl group, a 2,2,2-trifluoroethyl group, a 3,3,3-trifluoropropyl group, an allyloxyundecyl group, a vinyloxybutyl group, a styrylethyl group, an acetoxypropyl group, an acetoxymethyl group, a 2-(acryloxyethyl) group, a 2-(2-ethoxyethoxy)ethan-1-ol group, a 1-(p-hydroxyphenyl)ethyl group, a 2-(p-hydroxyphenyl)ethyl group, a 4-hydroxy-5-(p-hydroxyphenylcarbonyloxy)pentyl group, a benzoyloxypropyl group, a phenyl group, a tolyl group, a p-hydroxyphenyl group, and a vinyl group are given as preferable groups.

Furthermore, preferable examples of the arylene group which may be substituted, a biphenylene group which may substituted, an alkylene group having 1 to 4 carbon atoms, which may substituted, and an alkynylene group having 2 to 4 carbon atoms, which may substituted, of $M^1$ or $M^2$ include a phenylene group, a naphthylene group, a biphenylene group, a methylene group, an ethylene group, a propenylene group, a butenylene group, an ethynylene group, a 1,3-butadinylene group etc.

Further, preferable examples of the alkoxy group having 1 to 6 carbon atoms of $Y^1$ to $Y^6$ include the same groups as in X. $R^2$ to $R^7$ and $Y^1$ to $Y^6$ may be the same or different from each other as described above.

Specific examples of silicon compound (ii) include 1,4-bis(dimethylethoxysilyl)benzene, 1,4-bis(diethylchlorosilyl)benzene, 1,4-(diethylchlorosilyl)ethane, and 1,4-bis(methyldiethoxysilyl)benzene.

The polysiloxane (I) of the present invention can be prepared by the same method as the previously known method for preparing polysiloxane. That is, the polysiloxane can be prepared as follows. First, a mixture solution of the silicon compound (i) and the silicon compound (ii) is dropwise added or collectively charged to or in a reaction system consisting of an organic solvent or a two phase system containing an organic solvent and water, in which an acidic or basic catalyst is contained, to perform a hydrolysis-condensation reaction. Then, the resultant reaction solution is refined by removal of byproducts through neutralization or washing, or the concentration thereof is changed by condensation, or the reaction solvent is replaced to a desired organic solvent, as needed. In addition, when collectively charged, an organic solvent containing an acidic or basic catalyst may be added to a mixture solution of the silicon compounds (i) and (ii).

The reaction temperature of the silicon compounds is preferably 0 to 200° C., more preferably 10 to 60° C. The temperature at dropwise adding and the reaction temperature may be the same or different. The reaction time varies depending on the substituent etc. of the silicon compounds represented by the aforementioned formulae (a), (b), and (c) but is usually from several tens of minutes to several tens of hours. Polysiloxanes having a structure and physical properties suitable for an objective use can be obtained by setting various conditions at the hydrolysis and condensation reaction, for example, the amount of catalyst, the reaction temperature, the reaction time etc. in consideration of the scale of reaction, the size and shape of reaction vessel etc.

As the organic solvent used at reaction, solvents not having reactivity with the silicon compound are used alone or in a combination of two or more thereof. Specific examples of such organic solvents include hydrocarbon solvents such as hexane, benzene, toluene, and xylene; ether solvents such as diethyl ether, tetrahydrofuran, and propylene glycol monomethyl ether (PGME); ester solvents such as ethylacetate and propylene glycol monomethyl ether acetate (PGMEA); alcohol solvents such as methanol, ethanol, isopropanol, butanol, and 1,3-propanol; and ketone solvents such as acetone, methyl ethyl ketone, and methyl isobutyl ketone. The amount thereof is 0.1 to 10 weight times, preferably 0.5 to 2 weight times a mixture solution of silicon compound (i) and silicon compound (ii). The solvent is preferably a hydrophobic organic solvent from the point of view of separating and refining the synthesized polysiloxane.

On the other hand, preferable examples of the basic catalyst include organic bases such as trimethylamine, triethylamine, tripropylamine, tributylamine, tripentylamine, trihexylamine, triheptylamine, trioctylamine, diethylamine, triethanolamine, diethanolamine, alkoxysilanes having an amino group, pyridine, picoline, dimethylaniline and derivatives thereof, secondary amines having a sterically hindering group, phosphine, stibine, arsine and derivatives thereof (for example, trimethylphosphine, dimethylethylphosphine, methyldiethylphosphine, triethylphosphine, trimethylarsine, and trimethylstibine); inorganic bases such as sodium hydroxide and potassium hydroxide; anion exchange resins; quaternary ammonium compounds such as tetrabutylammonium hydroxide, tetraethylammonium hydroxide, and tetramethylammonium hydroxide; and the like. Sodium hydroxide, potassium hydroxide, and tetramethylammonium hydroxide are preferable compounds from the point of view of the easy availability and the easiness of reaction. The amount of the catalyst is preferably 0.0001 to 10 mol times the amount of mixture of silicon compounds.

Examples of the acidic catalyst include hydrochloric acid, nitric acid, sulfuric acid, hydrofluoric acid, phosphoric acid, acetic acid, trifluoroacetic acid, formic acid, polyvalent carboxylic acid or anhydride thereof, and ion exchange resins. The amount of the catalyst added, which depends on the strength of acid, is preferably 0.0001 to 10 mol times the amount of mixture of silicon compounds.

The degree of hydrolysis can be adjusted by an amount of water added when the basic catalyst is used or by a reaction time (a stirring time) when the acidic catalyst is used.

After the end of reaction, the catalyst remaining in the reaction system may be neutralized by adding an acid when an alkali catalyst was used or by adding a base when an acid catalyst was used and the neutralization reaction is brought to the end by stirring the solution for the predetermined time. The amount of the neutralization agent is appropriately selected depending pH of the reaction solution after reaction and is preferably 0.5 to 1.5 mol times, more preferably 1 to 1.1 mol times the amount of the catalyst used. The reaction solution obtained is purified by washing with water as needed and then concentrated to obtain the polysiloxane (I). At this concentration, the solvent can be replaced by adding a desired solvent. The temperature of washing is not particularly limited but is preferably 0° C. to 70° C., more preferably 10° C. to 60° C. Further, the temperature when separating a water layer and an organic layer is not particularly limited too but is preferably 0° C. to 70° C., and more preferably 10° C. to 60° C. from the viewpoint of shortening the liquid separation time.

Thus, polysiloxane (I) used for the heat- or photo-curable composition of the invention is prepared. A dissolution rate (ADR) of the polysiloxane (I) film after prebaked in a 2.38 weight % tetramethylammoniumhydroxide (TMAH) aqueous solution is preferably 50 to 20,000 Å/second, more preferably 1,000 to 12,000 Å/second when the polysiloxane (I) is contained in a photo-curable composition (i.e. a negative-working photosensitive composition) and the photo-curable composition is negatively developed.

Alkali Dissolution Rate in a TMAH Aqueous Solution

The dissolution rates of polysiloxane in a TMAH aqueous solution is measured as follows. That is, polysiloxane is diluted to a polysiloxane concentration of 35 weight % with PGMEA and then dissolved while stirring with a stirrer for one hour at a room temperature. One cc of the thus prepared polysiloxane solution is dripped on a center of a 4-inch silicon wafer of 525 μm in thickness by using a pipette in a clean room under an atmosphere of a temperature: 23.0±0.5° C. and a humidity: 50±5.0% and then spin coated so that the film thickness becomes 2±0.1 μm. After this, solvent in the coated film is removed by heating on a hot plate at 100° C. for 90 seconds. The thickness of the coated layer is measured with a spectroscopic ellipsometer manufactured by J. A. Wooliam Co.

This silicon wafer having the film is immersed calmly into 100 ml of a TMAH aqueous solution having a predetermined concentration, which is contained in a petri dish of 6 inches in diameter and adjusted to a temperature of 23.0±0.1° C., and leaved to stand, and a time until the layer disappears is measured. The dissolution rate is calculated by dividing the film thickness by a time until a film existing in a 10 mm inner part from the edge of the wafer disappears. When the dissolution rate is remarkably slow, the wafer with the film is immersed in the TMAH aqueous solution for a predetermined time and then the wafer having the film is dried on a hot plate at 200° C. for 5 minutes in order to remove water in the film during the measurement of a dissolution rate, followed by measuring the film thickness. The dissolution rate is calculated by dividing a variation amount of film thicknesses before and after immersion by an immersion time. The above measurement is repeated five times and the mean value of the thus obtained values is made to the dissolution rate of polysiloxane.

(II) Polymerization Initiator

The silicon-containing heat- or photo-curable composition of the present invention comprises a polymerization initiator. This polymerization initiator includes a polymerization initiator which generates an acid or a base by the action of light and a polymerization initiator which generates an acid or a base by the action of heat.

As the polymerization initiator used in the present invention, a photo acid generator which is decomposed by irradiating light and generates an acid that is an active material for curing the composition, a photo base generator which can generate a base as an active material, a thermal acid generator which is decomposed by heating and generates an acid that is an active material for curing the composition, and a thermal base generator which can generate a base as an active material. Examples of light include visible rays, ultravioletrays, far-ultravioletrays, infrared rays, far-infrared rays, X-rays, an electron beam, an alpha ray, and a gamma ray.

The optimal amount of the polymerization initiator varies by the kind and amount of an active material which is generated by decomposition of the polymerization initiator, a sensitivity required, and dissolution contrast between exposed parts and unexposed parts. The amount thereof is preferably 0.001 to 10 weight parts, more preferably 0.01 to 5 weight parts to 100 weight parts of the total weight of polysiloxanes. When the amount is less than 0.001 weight parts, the dissolution contrast is too low and the effect of addition thereof is not always shown. On the other hand, when the amount of the polymerization initiator is more than 10 weight parts, cracks are sometimes generated in the film formed or colorlessness transparency is sometimes lowered by the remarkable coloring of the cured layer, which is caused by a decomposition of the polymerization initiator. Furthermore, the use of a larger amount of the polymerization initiator causes deterioration in the electric insulation of the cured material or the gas release by the thermal decomposition of the polymerization initiator. These can become a problem at a post process. Further, resistance properties of the cured film for a photoresist stripper, main agents of which are monoethanolamine and so on, can be deteriorated.

Examples of the aforementioned photo acid generator include diazomethane compounds, diphenyliodonium salts, triphenylsulfonium salts, sulfonium salts, ammonium salts, phosphonium salts, sulfonimide compounds, and so on. The structure of these photo acid generators can be represented by the formula (A) below.

$$R^+X^- \qquad (A)$$

In the formula, $R^+$ represents an organic ion selected from a group consisting of an alkyl group, an aryl group, an alkenyl group, an acyl group, and an alkoxy group modified by a hydrogen atom, a carbon atom or a hetero atom, for example, diphenyliodonium ion and triphenylsulfonium ion.

On the other hand, $X^-$ is preferably any one of counter ions represented by the formulae described below.

$SbY_6^-$ $AsY_6^-$ $R^a_p PY_{6-p}^-$ $R^a_q BY_{4-q}^-$ $R^a_q GaY_{4-q}^-$ $R^a SO_3^-$ $(R^a SO_2)_3 C^-$ $(R^a SO_2)_2 N^-$

$R^b COO^-$ $SCN^-$

In the formulae, Y represents a halogen atom, $R^a$ represents an alkyl group having 1 to 20 carbon atoms or an aryl group having 6 to 20 carbon atoms, which is substituted by a substituent selected from a fluorine atom, a nitro group, and cyano group, $R^b$ represents a hydrogen atom or an alkyl group having 1 to 8 carbon atoms, p is a number of 0 to 6, and q is a number of 0 to 4.

Specific examples of the counter ion include one selected from a group consisting of $BF_4^-$, $(C_6F_5)_4B^-$, $((CF_3)_2C_6H_3)_4B^-$, $PF_6^-$, $(CF_3CF_2)_3PF_3^-$, $SbF_6^-$, $(C_6F_5)_4Ga^-$, $((CF_3)_2C_6H_3)_4Ga^-$, $SCN^-$, $(CF_3SO_2)_3C^-$, $(CF_3SO_2)_2N^-$, a formic acid ion, an acetic acid ion, a trifluoromethanesulfonic acid ion, a nonafluorobutanesulfonic acid ion, a methanesulfonic acid ion, a butanesulfonic acid ion, a benzenesulfonic acid ion, a p-toluenesulfonic acid ion, and a sulfonic acid ion.

Among photo acid generators used in the present invention, those generating sulfonic acids or boric acids are particularly preferred. Examples thereof include tolylcumyliodonium tetrakis(pentafluorophenyl)boric acid (PHOTOINITIATOR 2074 (Trade name) manufactured by Rhodia), diphenyliodonium tetra(perfluorophenyl)boric acid, and compounds in which the cationic part is composed of a sulfonium ions and the anionic part is composed of a pentafluoroboric acid ion. As other examples, for example, triphenylsulfonium trifluoromethanesulfonic acid, triphenylsulfonium camphorsulfonic acid, triphenylsulfonium tetra(perfluorophenyl)boric acid, 4-acetoxyphenyldimethylsulfonium hexafluoroarsenic acid, 1-(4-n-butoxynaphthalene-1-yl)terahydrothiophenium trifluoromethanesulfonic acid, 1-(4,7-dibutoxy-1-naphthalenyl)tetrahydrothiophenium trifluoromethanesulfonic acid, diphenyliodonium trifluoromethanesulfonic acid, diphenyliodonium hexafluoroarsenic acid, and so on are given. Furthermore, photo acid generators represented by following formulae can be also used.

-continued

In the formulae, A each independently represents a substituent selected from an alkyl group having 1 to 20 carbon atoms, an alkoxy group having 1 to 20 carbon atoms, an aryl group having 6 to 20 carbon atoms, an alkylcarbonyl group having 1 to 20 carbon atoms, an arylcarbonyl group having 6 to 20 carbon atoms, a hydroxyl group, and an amino group, p each independently represents an integer of 0 to 5, and B$^-$ represents a fluorinated alkyl sulfonate group, a fluorinated aryl sulfonate group, a fluorinated alkyl borate group, an alkyl sulfonate group, an aryl sulfonate group, and so on.

Compounds in which cations and anions represented by these formulae are mutually exchanged or photo acid generators in which cations or anions represented by these formulae are combined with various kinds of the aforementioned cations or anions may be used. For example, compounds in which any sulfonium ion represented in the formulae is combined with tetra(perfluorophenyl) boric acid ion and compounds in which any iodonium ion represented in the formulae is combined with tetra (perfluorophenyl) boric acid ion can be also used as the photo acid generator.

As examples of the aforementioned thermal acid generator, salts, esters, and the like, which can generate an organic acid such as various aliphatic sulfonic acids and salts thereof, various aliphatic carboxylic acids such as citric acid, acetic acid, and maleic acid and salts thereof, various aromatic carboxylic acids such as benzoic acid and phthalic acid and salts thereof, aromatic sulfonic acids and ammonium salts thereof, various amine salts, aromatic diazonium salts, and phosphonic acids and salts thereof are given. Among the thermal acid generators used in the present invention, salts of an organic acid and an organic base are particularly preferred and salts of a sulfonic acid and an organic base are more preferred.

Preferable examples of the thermal acid generator containing an sulfonic acid include p-toluenesulfonic acid, benzenesulfonic acid, p-dodecylbenzenesulfonic acid, 1,4-naphthalenedisulfonic acid, methanesulfonic acid, etc. These acid generators can be used singly or as a mixture.

Examples of the aforementioned photo base generator include multi-substituted amide compounds having an amide group, lactam compounds, imide compounds or compound containing these structures.

Examples of the aforementioned thermal base generator include imidazole derivatives such as N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitrobenzyloxycarbonyl)imidazole; 1,8-diazabicyclo(5,4,0)undecene-7; tertiary amines; quaternary ammonium salts; and mixtures thereof.

These base generators may be used singly or as a mixture like the photo acid generator.

(III) Solvent

The silicon-containing heat- or photo-curable composition of the present invention comprises a solvent. The solvent may be any one of solvents which can uniformly dissolve or disperse the aforementioned polysiloxanes, polymerization initiators, and additives which may be added as needed and is not particularly limited. Examples of solvents which can be used in the present invention include ethylene glycol monoalkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methylcellosolve acetate and ethylcellosolve acetate; propylene glycol alkyl ether acetates such as propylene glycol monomethyl ether acetate (PGMEA), propylene glycol monoethyl ether acetate, and propylene glycol monopropyl ether acetate; aromatic hydrocarbons such as benzene, toluene, and xylene; ketones such as methyl ethyl ketone, acetone, methyl amyl ketone, methyl isobutyl ketone, and cyclohexanone; alcohols such as ethanol, propanol, butanol, hexanol, cyclohexanol, ethylene glycol, and glycerin; esters such as ethyl lactate, ethyl 3-ethoxypropionate and methyl 3-methoxypropionate; and cyclic esters such as γ-butyrolactone. Of these, it is preferred to use propylene glycol alkyl ether acetates or esters from the viewpoints of easy availability, ease of handling, solubility of polymer, and the like. These solvents may be used alone or in a combination of two or more kinds thereof. The amount of the solvent used varies by a coating method or a required film thickness after applying. A thick film having a film thickness of more than 100 μm can be formed by one coating by using the composition of the present invention.

The content of solvent in the heat- or photo-curable composition can be arbitrarily adjusted according to a method of applying the heat- or photo-curable composition. When the composition is coated by a spray coating method, the ratio of solvent in the composition may be made 90 weight % or more. When coated by a slit coating method which is used in applying a large size substrate, the ratio of solvent is usually 60 weight % or more, preferably 70 weight % or more. The properties of the heat- or photo-curable composition according to the present invention do not change largely by the amount of solvent.

(IV) Additives

The heat- or photo-curable composition of the present invention may contain other additives, as needed. Examples of such additives include a developer dissolution accelerator, a scum remover, an adhesion enhancer, a polymerization inhibitor, a defoaming agent, a surfactant, a sensitizer, etc.

The developer dissolution accelerator or the scum remover has an action adjusting the solubility of the formed film in developer or preventing the occurrence of residual scum on a substrate after development. As such additives, crown ether compounds can be used. The crown ether compound having a simplest structure is compounds represented by the formula: (—CH$_2$—CH$_2$—O—)$_n$. In the present invention, compounds in which n is 4 to 7 in the aforementioned formula are preferred.

Crown ether is sometimes called x-crown-y-ether when the total number of atoms constituting a ring in the crown ether is assumed to be x and the number of oxygen atom in the atoms constituting the ring is assumed to be y. In the present invention, crown ethers selected from a group consisting of crown ethers in which x=12, 15, 18 or 21 and y=x/3 and benzo-condensates or cyclohexyl-condensates thereof are preferable. More preferred examples of crown ether include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Of these, 18-crown-6-ether and 15-crown-5-ether are most preferable in the present invention.

The addition amount thereof is preferably 0.05 to 15 weight parts, more preferably 0.1 to 10 weight parts based on 100 weight parts of polysiloxane.

The adhesion enhancer has an effect preventing peeling of patterns by a stress impressed after thermal process when a cured film is formed using a negative-working photosensitive composition of the present invention. As the adhesion enhancer, imidazoles and silane coupling agents are preferred. As the imidazoles, 2-hydroxybenzimidazole, 2-hydroxyethylbenzimidazole, benzimidazole, 2-hydroxyimidazole, imidazole, 2-mercaptimidazole, and 2-aminoimidazole are preferred and 2-hydroxybenzimidazole, benzimidazole, 2-hydroxyimidazole, and imidazole are used particularly preferably.

As the polymerization inhibitor, nitron, nitroxide radical, hydroquinone, catechol, phenothiazine, phenoxazine, hindered amine, and derivatives thereof as well as ultraviolet absorbers can be added. Of these, catechol, 4-t-butylcatechol, 3-methoxycatechol, phenothiazine, chlorpromazine, phenoxazine, TINUVIN 144, 292, and 5100 (manufactured by BASF) which are hindered amines, and TINUVIN 326, 328, 384-2, 400 and 477 (manufactured by BASF) which are ultraviolet absorbers are preferable. These can be used alone or in a combination of two or more. The addition amount thereof is preferably 0.01 to 20 weight parts based on 100 weight parts of polysiloxane.

As examples of the defoaming agent, alcohols having 1 to 18 carbon atoms, higher fatty acids such as oleic acid and stearic acid, higher fatty acid esters such as glycerol monolaurate, polyethers such as polyethylene glycol (PEG) (Mn: 200 to 10,000), and polypropylene glycol (PPG) (Mn: 200 to 10,000), silicone compounds such as dimethyl silicone oil, alkyl-modified silicone oil, and fluorosilicone oil, and organic siloxane-type surfactants specifically mentioned below. These can be used alone or in a combination of two or more thereof. The addition amount thereof is preferably 0.1 to 3 weight parts to 100 weight parts of the total polysiloxanes.

Furthermore, surfactants may be contained in the heat- or photo-curable composition of the present invention as necessary. The surfactant are added with the aim of improving the coating property, the developing property, and so on. As surfactants usable in the present invention, there are exemplified nonionic surfactants, anionic surfactants, and amphoteric surfactants.

Examples of the nonionic surfactant include polyoxyethylene alkyl ethers such as polyoxyethylene lauryl ether, polyoxyethylene oleyl ether, and polyoxyethylene cetyl ether, polyoxyethylene fatty acid diesters, polyoxy fatty acid monoesters, polyoxyethylene polyoxypropylene brock polymer, acetylene alcohols, acetylene glycols, polyethoxylates of acetylene alcohol, acetylene glycol derivatives such as polyethoxylate of acetylene glycol, fluorine atom-containing surfactants such as Fluorad (trade name, manufactured by Sumitomo 3M), Megafac (trade name, manufactured by DIC Corporation), and Sulflon (trade name, manufactured by ASAHI GLASS CO., LTD.), and organic siloxane surfactants such as KP341 (trade name, manufactured by Shin-Etu Chemical Co., Ltd.). As examples of the aforementioned acetylene alcohols and acetylene glycols, 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol are given.

Further, examples of the anionic surfactant include ammonium salts or organic amine salts of alkyl diphenyl ether disulfonic acid, ammonium salts or organic amine salts of alkyl diphenyl ether sulfonic acid, ammonium salts or organic amine salts of alkylbenzenesulfonic acid, ammonium salts or organic amine salts of polyoxyethylene alkyl ether sulfuric acid, and ammonium salts or organic amine salts of alkylsulfuric acid.

Examples of the amphoteric surfactant include 2-alkyl-N-carboxymethyl-N-hydroxyethylimidazolium betaine, and lauric acid amide propylhydroxysulfone betaine.

These surfactants can be used alone or in a combination of two or more thereof. The blending amount thereof is usually 50 to 10,000 ppm, preferably 100 to 1,000 ppm to the heat- or photo-curable composition of the present invention.

Sensitizers may be contained in the photo-curable composition of the invention, if necessary. As sensitizers preferably used in the present invention, there are exemplified coumarins, ketocoumarins, and derivatives thereof, thiopyrylium salts, acetophenones, and so on. Specific example of sensitizing dyes include p-bis(o-methylstyryl)benzene, 7-dimethylamino-4-methylquinolone-2,7-amino-4-methylcoumarin, 4,6-dimethyl-7-ethylaminocoumarin, 2-(p-dimethylaminostyryl)pyridylmethyl iodide, 7-diethylaminocoumarin, 7-diethylamino-4-methylcoumarin, 2,3,5,6-1H,4H-tetrahydro-8-methylquinolizino-<9,9a,1-gh←coumarin, 7-diethylamino-4-tri fluoromethylcoumarin, 7-dimethylamino-4-tri fluoromethylcoumarin, 7-amino-4-tri fluoromethylcoumarin, 2,3,5,6-1H,4H-tetrahydroxyquinolizino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolizino-<9,9a,1-gh←coumarin, 3-(2'-N-methylbenzimidazolyl)-7-N,N-diethylanimocoumarin, N-methyl-4-trifluoromethylpiperidino-<3,2-g>coumarin, 2-(p-dimethylaminostyryl)benzothiazolylethyl iodide, 3-(2'-benzimidazolyl)-7-N,N-diethylaminocoumarin, 3-(2'-benzthiazolyl)-7-N,N-diethylaminocoumarin, and pyrylium or thiopyrylium salts represented by the formula described below. When the sensitizing dye is added to the composition, patterning with a cheap light source such as a high pressure mercury lamp (360 to 430 nm) becomes possible. The addition amount thereof is preferably 0.05 to 15 weight parts, more preferably 0.1 to 10 weight parts to 100 weight parts of polysiloxane.

| X | $R_1$ | $R_2$ | $R_3$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

In addition, compounds having an anthracene skeleton can be used as the sensitizer. Specifically, the compounds represented by the formula (C) below are exemplified.

(C)

In the formula, $R^{31}$ is each independently a group selected from a group consisting of an alkyl group, an aralkyl group, an aryl group, a hydroxyalkyl group, an alkoxyalkyl group, a glycidyl group, and a halogenated alkyl group, $R^{32}$ is each independently a group selected from a group consisting of a hydrogen atom, an alkyl group, alkoxy group, a halogen atom, a nitro group, sulfonic acid group, a hydroxyl group, an amino group, and carboalkoxy group, and k is each independently 0 or an integer of 1 to 4.

When the sensitizer having an anthracene skeleton is used, the addition amount thereof is preferably 0.01 to 5 weight parts based on 100 weight parts of polysiloxane.

Method for Forming a Cured Film

The method for forming a cured film of the present invention comprises steps of; coating the heat- or photo-curable composition of the present invention to a substrate, generating an acid or a base by heating or photo-irradiating the coating film formed, developing if necessary, and forming a cured film by thermal process. The method for forming the cured film will be explained below in accordance with the order of the aforementioned steps.

(1) Coating Step

First, the heat- or photo-curable composition of the present invention is coated to a substrate. The formation of a coating film of the heat- or photo-curable composition according to the present invention can be performed by any conventionally known coating method as a coating method of a photosensitive composition etc. Specifically, the coating method is voluntarily selected from, for example, a dip coating method, a roll coating method, a bar coating method, a brush coating method, a spray coating method, a doctor coating method, a flowing and spreading coating method, a spin coating method, a slit coating method and so on. As a substrate to which the composition is coated, a suitable substrate such as a silicon substrate, a glass substrate, a resin film, or the like can be used. On these substrate, various semiconductor elements etc. may be formed as needed. When the substrate is a film, a gravure printing method can also be utilized. After formation of the coating film, a drying step may be provided as another step. The film thickness can be made a desired thickness by repeating the coating step two times or more, if necessary.

(2) Prebaking Step

After forming a coating film by coating the heat- or photo-curable composition, it is preferable to prebake (preheat) the coating film for drying and reducing the residual solvent content in the coating film. The prebaking process may be conducted usually at 40 to 150° C., preferably at 50 to 120° C. for 10 to 300 seconds, preferably for 30 to 120 seconds when heated on a hot plate or for 1 to 30 minutes when heated in a clean oven.

(3) Heating or Light-Exposure Step

After formation of the coating film, the coating film is heated or the surface of the coating film is irradiated by light. As a light source used for irradiating the coating film, any conventionally known light source used for performing a pattern formation by using a photosensitive composition can be utilized. Examples of the light sources include lamps such as a high pressure mercury lamp, a low pressure mercury lamp, a metal halide lamp, and a xenon lamp, a laser diode, and LED. When irradiated with infrared rays or far infrared rays, an infrared lamp, a far infrared lamp, or a laser diode may be used. When forming a sealing film or an insulation film in WL-CSP, 3D packaging or the like, a planarization film for a TFT substrate, an interlayer insulation film of a semiconductor element, and the like, ultraviolet rays such as g-line, h-line, i-line or the like are usually used as the irradiation light. Excluding an ultra-micro fabrication such as a semiconductor processing, it is general to use a light with a wavelength of 360 nm to 430 nm (from a high pressure mercury lamp) when conducting patterning of several micrometers to dozens micrometers. When producing a liquid crystal display, a light of 430 nm is used in many cases. In such case, it is advantageous to add a sensitizing dye to the photo-curable composition of the present invention, as previously stated. Although energy of irradiation light depends on the light source used and the film thickness of the coating film, it is made usually 5 to 2,000 mJ/cm², preferably 10 to 1,000m. J/cm². When the energy of irradiation light is lower than 5 mJ/cm², sufficient resolution cannot be obtained. On the contrary, when the energy is higher than 2,000 mJ/cm², halation can occur by overexposure. When heated or irradiated with heat rays, a conventionally known apparatus used for heating or heat ray-irradiating a heat-sensitive composition may be suitably used.

A photo mask generally used in the art may be used for pattern-like irradiation of light. The photo mask can be arbitrarily selected from well-known photo masks. Circumstances at the irradiation may be made, but is not particularly limited to, an atmosphere of environment (in the atmosphere) or an atmosphere of nitrogen gas. Furthermore, when the cured film is formed in a whole surface, full-exposure may be conducted. In the present invention, the patterned film includes the case where a film is formed on a whole surface. When the heat- or photo-curable composition of the present invention is a heat-curable composition, that is, the composition include a polymerization initiator which can generate an acid or a base by heat, an acid or a base may be generated in the whole coating film by heating the coating film at a higher temperature than the decomposition temperature of the polymerization initiator with a heating apparatus. When an acid or a base is generated by heating the coating film by an infrared irradiation, a pattern-like film can be formed by using a pattern-like mask or pattern-like irradiating by heat rays with a scanning apparatus.

(4) Post Exposure Baking Step

A post exposure baking can be performed in order to promote the reaction between polysiloxanes in the film by an acid or base generated at the exposed part, as needed. This baking process is not conducted for completely curing the coating film but conducted for enabling only a desired pattern to be left on a substrate after development and the other part to be removed by development.

When the post exposure baking is conducted, a hot plate, an oven, a furnace or the like can be used. As it is not preferable that the acid or base generated in the exposed area diffuses into an unexposed area, the heating temperature should not be made excessively higher. From these viewpoints, the range of the temperature at the post exposure baking is preferably from 40° C. to 150° C., more preferably from 60° C. to 120° C. The stepwise heating can be applied for controlling the curing speed of the composition, if necessary. Circumstances at the heating can be selected from, but are not limited to, an atmosphere of an inert gas such as a nitrogen gas, a vacuum atmosphere, a reduced pressure atmosphere, an oxygen gas atmosphere, or the like for controlling the curing speed of the composition. The heating time is preferably more than a given time for maintaining the uniformity of a temperature history in a wafer plane more highly but it is preferable to be not excessively long for preventing the diffusion of an acid or base generated. From these viewpoints, the heating time is preferably 20 seconds to 500 seconds, more preferably 40 seconds to 300 seconds.

(5) Development Step

The coating film is developed after exposure and post exposure baking which is conducted as necessary. As a developer used for development, any alkali developer conventionally used for developing a photosensitive composition can be used. Preferable examples of the developer include an alkali developer which is an aqueous solution of an alkaline compound such as tetraalkylammonium hydroxide, choline, alkali metal hydroxide, (hydrated) alkali metal metasilicate, (hydrated) alkali metal phosphate, ammonia, alkyl amine, alkanol amine, heterocyclic amine etc. Of these, a tetramethylammonium hydroxide aqueous solution is particularly preferred. These alkali developers may further comprise a water soluble organic solvent such as methanol, ethanol, or the like or surfactants if necessary.

The developing method can be arbitrarily selected from conventionally known methods. Specifically, a dipping into a developer, a paddle development, a shower development, a slit development, a cap coat development, a spray development, and so on are exemplified. Patterns can be obtained by the development. After the development with the developer, it is preferable to wash the film with water.

(6) Whole Surface Exposure Step

After development, a part where a photo-curing reaction occurred remains as a pattern. However, a curing at the outermost surface of the pattern by the reaction with an aqueous TMAH solution used as a developer occurs by reactivity of silanol. When shifted to the next heat curing step as it is, wrinkles occur on a surface of the pattern by heat-shrinkage of the resin. The whole surface exposure process is conducted with the aim to prevent these problems, that is, by whole surface exposure, the remaining photo acid generator (PAG) or photo base generator is completely decomposed and an enough amount of acid or base generates. By this, a uniform curing is caused and a uniform pattern with no deformation at the surface is obtained.

(7) Thermal Process

After development, the pattern obtained is cured by heating or by thermal process the film in which an acid or base was generated by heating merely. The heating apparatus used in the thermal process may be the same as the heating apparatus used in the post exposure baking process. The temperature at this thermal process may be a temperature being able to cure the film and no other limitation is needed. But if a silanol group remains, the chemical resistance of the cured film can become insufficient or the dielectric constant can become higher. From these viewpoints, the heating temperature is preferably 200° C. or more and from the viewpoint of preventing cracking, it is preferably 350° C. or less. Particularly, in use of 3D packaging, it is preferably 250° C. or less as the film formation temperature of a solder is limited. Furthermore, the heating time is not limited but is set generally from 10 minutes to 24 hours, preferably from 30 minutes to 3 hours. This heating time means a time after the temperature of the pattern film reaches a predetermined heating temperature. The time needed till the temperature of the pattern film reaches from a temperature before heating to a predetermined temperature is from several minutes to several hours in general. When a cured film is formed without light-exposure, a heat-decomposition step of the polymerization initiator and a heat-curing step can be performed in succession but these steps may be conducted by a single step.

The thus obtained cured film has a low thermal expansion as it has a thermal expansion coefficient of $40 \times 10^{-6}/°$ C. or less, more preferably $20 \times 10^{-6}/°$ C. or less and can attain an excellent heat resistance, an excellent chemical resistance, excellent insulation properties, and low dielectric properties. For example, a loss of a film which is cured at 250° C., at 350° C. is 5% or less. The film, therefore, has a sufficient heat resistance. Furthermore, the cured film can attain a light transmittance of 95% or more and a dielectric constant of 3 or less. Further, it has a resistance for chemical liquids which are used in use of 3D packaging which is a post-process of IC preparation processes, for example, a flux, a Ti etchant, and a 2.38% TMAH aqueous solution, and has a sufficient resistance for a chemical liquid for Cu plating. Further, as the main chain of the cured polymer is Si—O—Si, the cured film has a heat expansion coefficient of 40 ppm or less. It is, therefore, said that the film is suitable for use of packaging in comparison with polyimide, polybenzoxazole, and benzocyclobutene (BCB) resin which were used heretofore. In addition, it can be preferably utilized in many ways as a planarization film of the aforementioned various elements, an interlayer insulation film for low-temperature polysilicon, a buffer coat film for IC Chips, a transparent protection film etc. beyond the field of IC.

Thus, the heat- or photo-curable composition of the present invention enables to form a thick film and the cured coating film formed is excellent in a low heat expansion property, a heat resistance, an insulation property, and a chemical resistance. Therefore, it can be particularly preferably used as a sealing film, an insulation film and so on for WL-CSP, 3D packaging and the like. In addition to this, it can be preferably utilized as a planarization film for various elements, an interlayer insulation film, a buffer coat film, a transparent protection film, a hard coat layer etc.

Hereinafter, the present invention will be specifically described with reference to Examples and Comparative examples. However, it should be understood that the present invention is not restricted by these Examples and Comparative examples.

SYNTHESIS EXAMPLES

Synthesis Example of a Polysiloxane Resin

First, Synthesis examples of polysiloxane used in the present invention will be explained below. When measuring physical properties and the like and forming a coating film at synthesis examples, examples, and comparative examples, following instruments and conditions were utilized.

Gel permeation chromatography (GPC) was measured using HLC-8220GPC type high-speed GPC system (trade name) manufactured by TOSOH CORPORATION and two Super Multipore HZ-N type GPC columns (trade name) manufactured by TOSOH CORPORATION. The measurement was conducted by following analysis conditions: that is, monodisperse polystyrene is used as a standard sample, tetrahydrofran is used as a developing solvent, a flow rate is 0.6 ml/minute, and a temperature of column is 40° C.

Spin coater MS-A100 type (trade name) manufactured by MIKASA CO, LTD was used for applying the composition and a thickness of the film formed was measured by Thickness gage VM-1200 type (trade name) manufactured by Dainippon Screen Mfg. Co., Ltd.

Synthesis Example 1

To a three-necked flask equipped with a mixer, a thermometer, and a condenser, 0.3 mol (53.8 g) of methyltriethoxysilane, 0.2 mol (48 g) of phenyltriethoxysilane, and 0.1 mol (27.6 g) of 1,4-bis(dimethylethoxysilyl)benzene were charged. 150 g of PGME were added thereto and the mixture was stirred at a predetermined speed. An aqueous caustic soda solution obtained by dissolving 17 g of caustic soda in 10 g of water was then charged into the flask and the reaction was continued for one hour. The resulting solution was added to a mixture solution of 48.7 g of 35% HCl aqueous solution with 150 g of water to neutralize caustic soda. The neutralization time was one hour long. 300 g of propyl acetate was then added dropwise into the neutralized solution, followed by stirring for 30 minutes. The solution thus obtained was separated into two layers of an oil layer and a water layer by using a separating funnel. The oil layer separated was washed four times with 400 cc of water per one washing to further remove sodium remained in the oil layer. At this time, it was confirmed that pH of the waste water was 4 to 5. The molecular weight of a polymer obtained (Polymer A) measured by GPC was 1,200 by Mn and 2,400 by Mw.

The polymer was adjusted to a predetermined concentration and coated on a silicon wafer at 50 μm in thickness by the spin coating. The coated layer was cured in the atmosphere at 300° C. for 1 hour. No crack was found in the film. Therefore, the polymer gave an excellent crack threshold. The alkali dissolution rate (ADR) of the polymer in a 2.38% TMAH aqueous solution was 8,000 Å/second.

(Measurement of a Coefficient of Thermal Expansion (CTE))

The coefficient of thermal expansion of the cured layer formed by the polymer synthesized in Synthesis example 1 was measured as follows. That is, an aluminum foil (50 μm in thickness) was stuck on a silicon wafer and the solution of the polymer synthesized in Synthesis example 1 was coated to the aluminum foil by a spin coating where the rotation number of a spin coater and the concentration of the solution were controlled so that the film thickness becomes 50 μm. The coated film was cured in the atmosphere at 250° C. for 1 hour. The aluminum foil with the coated film was peeled from the silicon wafer and the aluminum foil with the film derived from the polymer was immersed into an aqueous HCl solution to dissolve the aluminum foil and obtain a cured film of polysiloxane. The film was washed with water to remove hydrochloric acid on a surface, followed by drying at 100° C. for 5 minutes. Thus, a film of about 47 μm in thickness was obtained.

The CTE of the film was measured under following conditions by TMA (Thermal Mechanical Analysis).
Measurement apparatus: TMS/SS 7100 type (manufacture by SII NANOTECHNOLOGY CO.)
Measurement mode: Pulling mode
Measurement temperature: 25° C. to 250° C.
Temperature rising rate: 5° C./minute
Atmosphere: $N_2$ 200 ml CTE was 60 ppm ($\times 10^{-6}$/° C.) in an average at from 25° C. to 250° C. As a CTE of photosensitive polyimide was said to be about 100 ppm, superiority in CTE of silicon-based polymer was confirmed.

Synthesis Example 2

A synthesis of polymer was carried out in the same manner as in Synthesis example 1 except that the amount of 1,4-bis(dimethylethoxysilyl)benzene was changed to 0.4 mol (105.2 g). The molecular weight of a polymer obtained (Polymer B) was measured by the same manner as in Synthesis example 1 and Mn was 2,000 and Mw was 3,500. The film formation by the polymer obtained and the curing of the polymer obtained were conducted in the same manner as in Synthesis example 1. No crack was found on the film. The alkali dissolution rate (ADR) of the film in a 2.38% TMAH aqueous solution was 10,000 Å/second.

Synthesis Example 3

A synthesis of polymer was carried out in the same manner as in Synthesis example 1 except that 1,4-bis(dimethylethoxysilyl)benzene was changed to 1,4-bis(dimethylchlorosilyl)benzene. The molecular weight of a polymer obtained (Polymer C) was measured by the same manner as in Synthesis example 1 and Mn was 1,300 and Mw was 2,400. The film formation by the polymer obtained and the curing of the polymer obtained were conducted in the same manner as in Synthesis example 1. No crack was found on the film. The alkali dissolution rate (ADR) of the film in a 2.38% TMAH aqueous solution was 12,000 Å/second.

Synthesis Example 4

A synthesis of polymer was carried out in the same manner as in Synthesis example 1 except that 0.1 mol of 1,4-bis(dimethylchlorosilyl)benzene and 0.1 mol of 1,4-bis(dimethylchlorosilyl)ethane were used instead of 0.1 mol of 1,4-bis(dimethylethoxysilyl)benzene. The molecular weight of a polymer obtained (Polymer D) was measured by the same manner as in Synthesis example 1 and Mn was 2,700 and Mw was 4,500. The film formation by the polymer obtained and the curing of the polymer obtained were conducted in the same manner as in Synthesis example 1. No crack was found on the film. The alkali dissolution rate (ADR) of the film in a 2.38% TMAH aqueous solution was 5,000 Å/second.

Synthesis Example 5

A synthesis of polymer was carried out in the same manner as in Synthesis example 1 except that the amount of methyltriethoxysilane was changed to 0.7 mol (119 g) and the amount of phenyltriethoxysilane was change to 0.3 mol (72 g). The molecular weight of a polymer obtained (Polymer E) was measured by the same manner as in Synthesis example 1 and Mn was 1,300 and Mw was 2,500. The film formation by the polymer obtained and the curing of the polymer obtained were conducted in the same manner as in Synthesis example 1. No crack was found on the film. The alkali dissolution rate (ADR) of the film in a 2.38% TMAH aqueous solution was 10,000 Å/second.

Synthesis Example 6

A synthesis of polymer was carried out in the same manner as in Synthesis example 1 except that 1,4-bis(dimethylethoxysilyl)benzene was changed to 1,4-bis(methyldiethoxysilyl)benzene. The molecular weight of a polymer obtained (Polymer F) was measured by the same manner as in Synthesis example 1 and Mn was 2,500 and Mw was 4,500. The film formation by the polymer obtained and the curing of the polymer obtained were conducted in the same manner as in Synthesis example 1. No crack was found on the film. The alkali dissolution rate (ADR) of the film in a 2.38% TMAH aqueous solution was 10,000 Å/second.

Comparative Synthesis Example

A synthesis of polymer was carried out in the same manner as in Synthesis example 1 except that 1,4-bis(dimethylethoxysilyl)benzene was not used and only 0.3 mol (53.8 g) of methyltriethoxysilane and 0.2 mol (48 g) of phenyltriethoxysilane were charged. The molecular weight of a polymer obtained (Polymer H) was measured by the same manner as in Synthesis example 1 and Mn was 1,100 and Mw was 1,500. The film formation by the polymer obtained and the curing of the polymer obtained were conducted in the same manner as in Synthesis example 1. Cracks were found on the film. The alkali dissolution rate (ADR) of the film in a 2.38% TMAH aqueous solution was 2,000 Å/second.

The synthesis conditions in the aforementioned synthesis examples, and the number average molecular weights (Mn), the weight average molecular weight (Mw), and the alkali dissolution rates (ADR) of the polymers obtained will be summarized in Table 1 below.

TABLE 1

| Synthesis Example | MeSi(OEt)$_3$ (mol) | PhSi(OEt)$_3$ (mol) | DCSB·OEt (mol) | DCSB·Cl (mol) | DCSE (mol) | TCDSB (mol) | Mn | Mw | ADR (Å/s) | Cracks |
|---|---|---|---|---|---|---|---|---|---|---|
| 1 | 0.3 | 0.2 | 0.1 | | | | 1200 | 2400 | 8000 | None |
| 2 | 0.3 | 0.2 | 0.4 | | | | 2000 | 3500 | 10000 | None |
| 3 | 0.3 | 0.2 | | 0.1 | | | 1300 | 2400 | 12000 | None |
| 4 | 0.3 | 0.2 | | 0.1 | 0.1 | | 2700 | 4500 | 5000 | None |
| 5 | 0.7 | 0.3 | 0.1 | | | | 1300 | 2500 | 10000 | None |
| 6 | 0.3 | 0.2 | | | | 0.1 | 2500 | 4500 | 10000 | None |
| Comparison | 0.3 | 0.2 | | | | | 1100 | 1500 | 2000 | Exist |

MeSi(OEt)$_3$: Methyltriethoxysilane
PhSi(OEt)$_3$: Phenyltriethoxysilane
DCSB·OEt: 1,4-Bis(dimethylethoxysilyl)benzene
DCSB·Cl: 1,4-Bis(dimethylchlorosilyl)benzene
DCSE: 1,4-Bis(dimethylchlorosilyl)ethane
TCDSB: 1,4-Bis(methyldiethoxysilyl)benzene Example 1

The polysiloxane solution obtained in Synthesis example 1 was adjusted to a 70% PGMEA solution and a photo acid generator LW-S1B manufactured by San-Apro Ltd., which can act by irradiation of g-line or i-line and comprises a sulfonium salt, was added thereto so as to be 2 weight % to the weight of polysiloxane. In addition, a surfactant AKS-10 (trade name) manufactured by Shin-Etsu Chemical Co., Ltd. was added to the resulting solution so as to be 0.3 weight % to the weight of polysiloxane to obtain a negative-working photosensitive composition.

Figure 1:
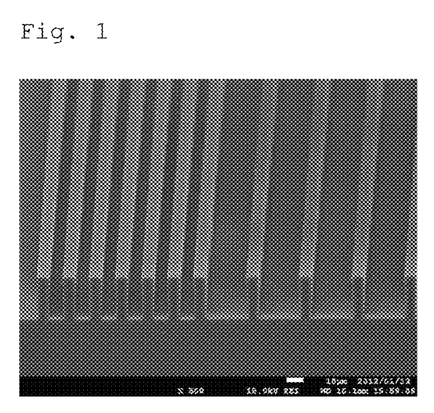
FIG. 1 is an optical microscope photograph of a 10 μm line and space (L/S) pattern with a film thickness of 25 μm, which is obtained in Example 1.

The composition was coated to a silicon wafer by a spin coating, followed by prebaking on a hot plate at 100° C. for 90 seconds to prepare a photosensitive layer of 25 μm in thickness. After prebaking, the layer was exposed at a dose of 24 mJ/cm$^2$ with a g- and h-lines exposure machine of Nikon FX-604 (NA=0.1), prebaked on a hot plate at 50° C. for 90 seconds, and then developed by immersing in a 2.38% TMAH aqueous solution for 60 seconds, followed by rinsing with pure water for 30 seconds. As a result, it was confirmed that unexposed parts in 5 μm and 10 μm line and space (L/S) patterns and 8 μm and 10 μm contact hole (C/H) patterns were completely removed without residue. After forming patterns, it was cured at 250° C. for 60 minutes. When the patterns cured were observed by an optical microscope, it was confirmed that these patterns in which unexposed parts were completely removed without residue were kept in a good shape. An optical microscope photograph of the 10 μm line and space pattern is shown in FIG. 1.

The dielectric constant (k), the voltage resistance, and the chemical resistance of the cured film obtained by the composition used in Example 1 were measured and evaluated by following methods. The results are shown in Table 2 below.

<Measurements of Dielectric Constant and Voltage Resistance>
(Preparation of Samples for Measurements of Dielectric Constant and Voltage Resistance)

The photosensitive composition used in Example was coated to a silicon wafer by a spin coating and then prebaking on a hot plate at 100° C. for 90 seconds to adjust the film thickness to 0.8 μm. The film was full-exposed at the same exposure amount as at the pattern formation in Example (for example, 24 mJ/cm$^2$ in Example 1) with a g- and h-lines exposure machine of Nikon FX-604 (NA=0.1) and was heat-treated again after exposure on a hot plate at 50° C. for 90 seconds, followed by immersing in a 2.38% TMAH aqueous solution for 60 seconds and rinsing with pure water. The film rinsed was cured at the same temperature and time as those in Example (for example, at 250° C. for 60 minutes in Example 1) to prepare a cured sample film.
(Measurement and Calculation of Dielectric Constant)

The measurement of the dielectric constant was performed by measuring the C-V characteristics at a measurement frequency of 100 KHz with a capacitance measurement device 495-type manufactured by Solid State Instrument Co. with a mercury probe method and the dielectric constant was calculated from the saturation capacitance obtained.
(Measurement and Calculation of Voltage Resistance)

An I-V data was measured using the same device as that used in the measurement of dielectric constant and the voltage resistance was determined by a voltage value at leakage.
<Measurement and Evaluation of Chemical Resistance>

The photosensitive composition used in Example was coated to a silicon wafer by a spin coating so as to become film thickness of 10 μm. The wafer cured on a hot plate at 250° C. was immersed in a flux-clean solvent at 70° C. for 1 hour and then a change of film thickness before and after immersion was measured. From the variation obtained, a remaining film thickness ratio was calculated and the chemical resistance was determined on basis of below criteria.
(Evaluation Criteria)
A: 95% or more
B: 90% or more
C: 80% or more
D: less than 80%
N/A: Unmeasurable (No remaining film exists.)

Example 2

Cured films were formed by the same manner as in Example 1 except for changing the last curing temperature from 250° C. to 300° C. When the cured films formed were observed using an optical microscope, all of patterns wherein it is confirmed that compositions in unexposed parts were completely removed without residue were kept in a good shape. In addition, samples for measurements were prepared using the photosensitive composition of Example 2 according to the aforementioned preparation methods of samples for measurements of a dielectric constant, a voltage resistance, and a chemical resistance and then the dielectric constant, the voltage resistance, and the chemical resistance thereof were measured and evaluated according to the aforementioned measurement and evaluation methods in the same manner as in Example 1. The results are shown in Table 2.

Example 3

Figure 2:
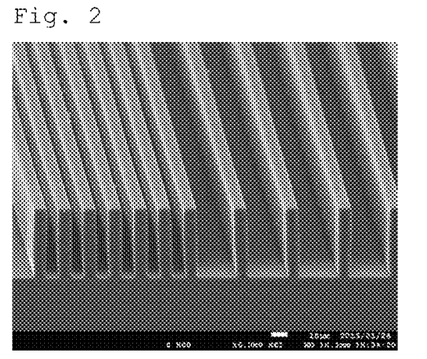
FIG. 2 is an optical microscope photograph of a 10 μm line and space (L/S) pattern with a film thickness of 50 μm, which is obtained in Example 3.
Figure 3:
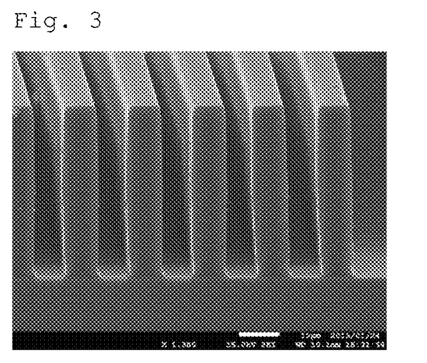
FIG. 3 is an enlarged photograph of the optical microscope photograph of FIG. 2.

When patterns were formed by the same manner as in Example 1 except for changing the film thickness from 25 μm to 50 μm and the exposure amount from 24 mJ/cm$^2$ to 36 mJ/cm$^2$, it was confirmed that all of compositions in unexposed areas of 8 μm and 10 line and space (L/S) patterns and a 10 μm contact hole (C/H) pattern were completely removed without any residue. After the pattern formation, the patterns were cured at 250° C. When the cured patterns were observed using an optical microscope, all patterns, wherein it was confirmed that the compositions in unexposed areas were completely removed without residue, were kept in a good shape. An optical microscope photograph of the 10 μm line and space pattern is shown in FIG. 2 and an enlarged microscopic photograph of the optical microscope photograph shown in FIG. 2 is shown in FIG. 3.

Furthermore, samples for measurements were prepared according to the aforementioned preparation methods of samples for measurements of a dielectric constant, a voltage resistance, and a chemical resistance and then the dielectric constant, the voltage resistance, and the chemical resistance were measured and evaluated. The results are shown in Table 2.

Example 4

Patterns and cured films were formed by the same manner as in Example 1 except for changing Polymer A obtained by Synthesis example 1 to Polymer B obtained by Synthesis example 2, the film thickness from 25 μm to 50 μm, and the exposure amount from 24 mJ/cm$^2$ to 30 mJ/cm$^2$. The resolution of the line and space pattern was 10 μm (the composition in an unexposed part of the 10 μm line and space pattern was completely removed without residue). When the cured film was observed using an optical microscope, the 10 μm line and space pattern, wherein it was confirmed that the composition in an unexposed area were completely removed without residue, were kept in a good shape.

Furthermore, samples for measurement were prepared according to the aforementioned preparation methods of samples for measurements of a dielectric constant, a voltage resistance, and a chemical resistance and then the dielectric constant, and the voltage resistance, and the chemical resistance of the cured films were measured and evaluated. The results are shown in Table 2.

Examples 5 to 8

Patterns and cured films were formed by the same manner as in Example 4 except for changing Polymer B obtained in Synthesis example 2 to Polymer C (Example 5), Polymer D (Example 6), Polymer E (Example 7), or Polymer F (Example 8), the exposure amount to 35 mJ/cm$^2$ (Example 5), 60 mJ/cm$^2$ (Example 6), 35 mJ/cm$^2$ (Example 7), or 40 mJ/cm$^2$ (Example 8), and the film thickness to 25 μm in only Example 8. The resolutions of the line and space patterns in Examples 5 to 8 were respectively 13 μm, 15 μm, 10 μm, and 10 μm. When the cured films were observed using an optical microscope, all of the aforementioned line and space patterns having the resolution of 13 μm, 15 μm, 10 μm, and 10 μm were kept in a good shape.

Furthermore, samples for measurements for each Example were prepared according to the aforementioned preparation methods of samples for measurements of a dielectric constant, a voltage resistance, and a chemical resistance and then the dielectric constants, the voltage resistances, and the chemical resistances of each cured films were measured and evaluated. The results are shown in Table 2.

Comparative Example

Patterns and cured films were formed by the same manner as in Example 1 except for changing Polymer A obtained in Synthesis example 1 to Polymer H obtained in Comparative synthesis example, the film thickness from 25 μm to 5 μm, and the exposure amount from 24 mJ/cm² to 30 mJ/cm². The resolution of the line and space pattern was 3 μm. When the cured films were observed using an optical microscope, all patterns were kept in a good shape.

Furthermore, samples for measurement were prepared according to the aforementioned preparation methods of samples for measurements of a dielectric constant, a voltage resistance, and a chemical resistance (but the film thickness was 5 μm) and then the dielectric constant, the voltage resistance, and the chemical resistance were measured and evaluated. The results are shown in Table 2.

In Table 2, polymers of the photosensitive compositions, the amounts of the photo acid generator (PAG), curing temperatures, the evaluated film thicknesses, the exposure amounts, and the resolutions of line and space pattern as well as the dielectric constants (k), the voltage resistances, and the chemical resistances of cured film in the aforementioned examples and a comparative example are summarized.

TABLE 2

| Example | Polymer | Amount of PAG (%) | Curing temperature (° C.) | Evaluated film thickness (μm) | Exposure amount (mJ/cm²) | Resolution L&S (μm) | Dielectric constant (k) | Voltage resistance (MV/cm) | Chemical resistance |
|---|---|---|---|---|---|---|---|---|---|
| 1 | A | 2 | 250 | 25 | 24 | 5 | 3 | 4 | B |
| 2 | A | 2 | 300 | 25 | 24 | 5 | 2.8 | 4 | B |
| 3 | A | 2 | 250 | 50 | 36 | 8 | 3 | 4 | B |
| 4 | B | 2 | 250 | 50 | 30 | 10 | 3.1 | 4 | B |
| 5 | C | 2 | 250 | 50 | 35 | 13 | 3 | 4 | B |
| 6 | D | 2 | 250 | 50 | 60 | 15 | 3.1 | 3.5 | B |
| 7 | E | 2 | 250 | 50 | 35 | 10 | 2.9 | 4 | A |
| 8 | F | 2 | 250 | 25 | 40 | 10 | 3 | 4 | B |
| Comparative Example | H | 2 | 250 | 5 | 30 | 3 | 3.0 | 4 | D |

From Table 2, it is understood that the negative-working photosensitive composition of the present invention is able to form a thick film and all of resolutions at a thick film formation as well as the dielectric constant, the voltage resistance, and the chemical resistance of cured film by thermal process are excellent. In addition, these properties were similarly shown in the heat-curable composition. Furthermore, all of cured films formed by the negative-working photosensitive composition prepared in the aforementioned examples had a low thermal expansion.

The invention claimed is:

1. A heat- or photo-curable composition comprising;
(I) polysiloxane obtained by reacting at least one of silicon compounds (i) represented by the formula (a):

(a)

wherein, $R^1$ represents a hydrogen atom, a liner or branched alkyl group having 1 to 20 carbon atoms in which any —$CH_2$— group may be replaced by a —O—, —C≡C— or —CO— group and any hydrogen atom may be replaced by a fluorine atom, and which may have a substituent, an aryl group having 6 to 20 carbon atoms in which any hydrogen atom may be replaced by a fluorine atom and which may have a substituent, a cycloalkyl group having 3 to 20 carbon atoms in which any hydrogen atom may be replaced by a fluorine atom and which may have a substituent, or an alkenyl group having 2 to 20 carbon atoms in which any hydrogen atom may be replaced by a fluorine atom and which may have a substituent, X represents a chlorine atom or an ethoxy group, and n is 0 to 2, and at least one of silicon compounds (ii) represented by the formula (b):

(b)

wherein, $R^2$ to $R^5$ may be the same or different from each other and represent an alkyl group which may be substituted, an aryl group which may be substituted, or an alkenyl group which may be substituted, $M^1$ represents an arylene group which may be substituted, or a biphenylene group which may be substituted, or an alkynylene group having 2 to 4 carbon atoms which may be substituted, $Y^1$ and $Y^2$ may be the same or different from each other and represent a chlorine atom or an ethoxy group, or represented by the formula (c):

(c)

wherein, $R^6$ and $R^7$ may be the same or different from each other and represent an alkyl group which may be substituted, an aryl group which may be substituted, or an alkenyl group which may be substituted, $M^2$ represents an arylene group which may be substituted, or a biphenylene group which may be substituted, and $Y^3$ to $Y^6$ may be the same or different from each other and represent a chlorine atom or an ethoxy group, under an alkali catalyst or an acid catalyst, (II) a polymerization initiator which enables the generation of an acid or a base by the action of heat or light, and
(III) a solvent.

2. The heat- or photo-curable composition according to claim 1, wherein a dissolution rate of a film after prebaking of the polysiloxane (I) in a 2.38 weight % tetramethylammonium hydroxide aqueous solution is 50 to 20,000 Å/second.

3. The heat- or photo-curable composition according to claim 2, wherein a ratio of the silicon compounds (ii) to the whole silicon compounds is 0.1 to 40 mol %.

4. The heat- or photo-curable composition according to claim 2, wherein the polymerization initiator (II) is contained by 0.001 to 10 weight parts to polysiloxane (I) by 100 weight parts.

5. The heat- or photo-curable composition according to claim 1, wherein a ratio of the silicon compounds (ii) to the whole silicon compounds is 0.1 to 40 mol %.

6. The heat- or photo-curable composition according to claim 5, wherein the polymerization initiator (II) is contained by 0.001 to 10 weight parts to polysiloxane (I) by 100 weight parts.

7. The heat- or photo-curable composition according to claim 1, wherein the polymerization initiator (II) is contained by 0.001 to 10 weight parts to polysiloxane (I) by 100 weight parts.

8. The heat- or photo-curable composition according to claim 1, wherein at least one kind of additives selected from a group consisting of a developer dissolution accelerator, a scum remover, an adhesion enhancer, a polymerization inhibitor, a defoaming agent, a surfactant, and a photosensitizer is further contained.

9. A method for preparing a cured film which comprises the steps of: coating the heat- or photo-curable composition according to any one of claims 1 to 5 to a substrate to form a coating film; heating or light-exposing the coating film to generate an acid or a base; and curing the heated or light-exposed coating film by thermal process.

10. The method for preparing a cured film according to claim 9, wherein a photo-curable composition is used as the heat- or photo-curable composition and a step of developing a light-exposed coating film is further provided after the light-exposing step of the photo-curable composition wherein in the light exposing step, g-line, h-line, or l line is irradiating the light-exposed coating film.

11. A cured film which is formed from the heat- or photo-curable composition according to claim 1.

12. An element which comprises the cured film according to claim 11.

13. The heat- or photo-curable composition according to claim 1, wherein the silicon compounds (i) represented by the formula (a) is selected from the group consisting of compounds having formula (d), (e), and (f)

$$R^1{}_2Si(X)_2 \qquad (d)$$

$$R^1Si(X)_3 \qquad (e)$$

$$Si(X)_4 \qquad (f).$$

14. The heat- or photo-curable composition according to claim 13, wherein the silicon compounds (i) represented by the formula (a) is the compounds having formula (d).

15. The heat- or photo-curable composition according to claim 13, wherein the silicon compounds (i) represented by the formula (a) is the compounds having formula (e).

16. The heat- or photo-curable composition according to claim 13, wherein the silicon compounds (i) represented by the formula (a) is the compounds having formula (f).

17. The heat or photo curable composition according to claim 1, wherein the silicon compounds (ii) represented by the formula (b) is selected from the group consisting of 1,4-bis(dimethylethoxysilyl)benzene, and 1,4-bis(diethylchlorosilyl)benzene.

18. The heat or photo curable composition according to claim 1, wherein the silicon compounds (ii) represented by the formula (c) is 1,4-bis(methyldiethoxysilyl)benzene.

19. The heat or photo curable composition according to claim 1, wherein the silicon compounds (ii) represented by the formula (b) is 1,4-bis(dimethylethoxysilyl)benzene.

20. The heat or photo curable composition according to claim 1, wherein the silicon compounds (ii) are represented by the formula (b).

* * * * *